US011537929B2

(12) United States Patent
Bronn et al.

(10) Patent No.: US 11,537,929 B2
(45) Date of Patent: *Dec. 27, 2022

(54) SUPERCONDUCTING INTERPOSER FOR THE TRANSMISSION OF QUANTUM INFORMATION FOR QUANTUM ERROR CORRECTION

(71) Applicant: INTERNATIONAL BUSINESS MACHINES CORPORATION, Armonk, NY (US)

(72) Inventors: Nicholas T. Bronn, Long Island City, NY (US); Daniela F. Bogorin, Syracuse, NY (US); Patryk Gumann, Tarrytown, NY (US); Sean Hart, Tarrytown, NY (US); Salvatore B. Olivadese, Stamford, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/233,089

(22) Filed: Apr. 16, 2021

(65) Prior Publication Data

US 2021/0326740 A1  Oct. 21, 2021

Related U.S. Application Data

(63) Continuation of application No. 16/443,603, filed on Jun. 17, 2019, now Pat. No. 10,984,335.

(51) Int. Cl.
*H03M 13/00* (2006.01)
*G06N 10/00* (2022.01)
(Continued)

(52) U.S. Cl.
CPC ............. *G06N 10/00* (2019.01); *G06N 10/70* (2022.01); *H04L 1/0042* (2013.01); *H04L 1/0056* (2013.01); *H04B 10/90* (2013.01)

(58) Field of Classification Search
CPC ..... G06N 10/00; H04L 1/0042; H04L 1/0056; H04B 10/90
See application file for complete search history.

(56) References Cited

U.S. PATENT DOCUMENTS 5,648,320 A   7/1997  Jacobs
9,231,181 B2  1/2016  Thom et al.
(Continued)

FOREIGN PATENT DOCUMENTS

WO  2009046546 A1   4/2009
WO  2016199029 A1  12/2016
(Continued)

OTHER PUBLICATIONS

Touchette et al., "5-qubit Quantum error correction in a charge qubit quantum computer", arXiv: 1010.3242v1 [quant-ph] Oct. 15, 2010.
(Continued)

*Primary Examiner* — Samir W Rizk
(74) *Attorney, Agent, or Firm* — Amin, Turocy & Watson, LLP (57) ABSTRACT

A system for transmission of quantum information for quantum error correction includes an ancilla qubit chip including a plurality of ancilla qubits, and a data qubit chip spaced apart from the ancilla qubit chip, the data qubit chip including a plurality of data qubits. The system includes an interposer coupled to the ancilla qubit chip and the data qubit chip, the interposer including a dielectric material and a plurality of superconducting structures formed in the dielectric material. The superconducting structures enable transmission of quantum information between the plurality of
(Continued)

data qubits on the data qubit chip and the plurality of ancilla qubits on the ancilla qubit chip via virtual photons for quantum error correction.

12 Claims, 9 Drawing Sheets

(51) Int. Cl.
*H04L 1/00* (2006.01)
*G06N 10/70* (2022.01)
*H04B 10/90* (2013.01)

(56) References Cited

U.S. PATENT DOCUMENTS

| | | | |
|---|---|---|---|
| 9,748,976 | B2 | 8/2017 | Naaman et al. |
| 10,031,887 | B2 | 7/2018 | Raymond |
| 10,192,168 | B2 | 1/2019 | Rigetti et al. |
| 10,248,491 | B1 | 4/2019 | Zeng et al. |
| 10,984,335 | B2 * | 4/2021 | Bronn .................... H01L 25/18 |
| 2012/0135867 | A1 | 5/2012 | Thom et al. |
| 2018/0157986 | A1 | 6/2018 | Oxford et al. |
| 2018/0330266 | A1 | 11/2018 | Simmons et al. |
| 2019/0043822 | A1 | 2/2019 | Falcon et al. |

FOREIGN PATENT DOCUMENTS

| | | | |
|---|---|---|---|
| WO | 2018106222 | A1 | 6/2018 |
| WO | 2018/212041 | A1 | 11/2018 |
| WO | 2019004991 | A1 | 1/2019 |

OTHER PUBLICATIONS

Harke-Hosemann, et al., "Investigation of magnetic shielding for superconducting readout", Proc. of SPIE vol. 10708, Millimeter, Submillimeter, and Far-Infrared Detectors and Instrumentation for Astronomy IX, 1070846 (Jul. 9, 2018); doi: 10.1117/12.2314188, pp. 1070846-1-1070846-9.
Avci et al., "Performance Analysis of Direct Gold Wire Bonding on Superconducting YBa2Cu3O7-x Thin Films and Devices" IEEE Transactions on Applied Superconductivity, vol. 25, No. 4, Aug. 2015.
Bornibrook et al., "Parasitic Losses in Nb Superconducting Resonators", Physics Procedia 36 ( 2012 ) 187-192.
Haertling et al., "Environmental Test Program For Superconducting Material and Devices", Clemson University, Department of Ceramic Engineering College of Engineering, Contract No. NAG-1-1127, Jul. 26, 1991.
Broïse et al., "Superconducting Multilayer High-Density Flexible Printed Circuit Board for Very High Thermal Resistance Interconnections", J Low Temp Phys (2018) 193:578-584 https://doi.org/10.1007/s10909-018-1930-3.
Bhattacharya et al., "YBaCuO and TlBaCaCuO Superconductor Thin Films via an Electrodeposition Process", J. Electrochem. Soc., vol. 139, No. 1, Jan. 1992, pp. 67-69.
Majer et al., "Coupling superconducting qubits via a cavity bus", Nature, vol. 449, Sep. 27, 2007, pp. 443-447.
Pappas et al., "Enhanced superconducting transition temperature in electroplated rhenium", Applied Physics Letters 112, 182601 (2018), pp. 182601-1-182601-5.
Chow, "Quantum Information Processing with Superconducting Qubits", A Dissertation Presented to the Faculty of the Graduate School of Yale University in Candidacy for the Degree of Doctor of Philosophy, May 2010.
Fowler et al., "Surface codes: Towards practical large-scale quantum computation", Oct. 26, 2012.
Foxen et al. "High speed flux sampling for tunable superconducting qubits with an embedded cryogenic transducer", arXiv:1808.09612, Superconductor Science Technology, Jan. 2019.
"Superconductive Cryogenic PCB Manufacturer", Omni Circuit Boards, retrieved from https://www.omnicircuitboards.com.
PCT/EP2020/064208 International Search report dated Aug. 31, 2020.
PCT/EP2020/064208 Writtten Opinion dated Aug. 31, 2020.

* cited by examiner

SUPERCONDUCTING INTERPOSER FOR THE TRANSMISSION OF QUANTUM INFORMATION FOR QUANTUM ERROR CORRECTION

BACKGROUND

Currently claimed embodiments of the present invention relate to systems and methods for quantum error correction, and more specifically, to a superconducting interposer for the transmission of quantum information for quantum error correction.

As the number of qubits on a given quantum processor increases, it becomes necessary to move quantum information between qubits fabricated on separate chips, especially for applications such as quantum error correction. The current state of the art uses planar structures, such as bus resonators, to transmit quantum information between qubits.

SUMMARY

According to an embodiment of the present invention, a system for transmission of quantum information for quantum error correction includes an ancilla qubit chip including a plurality of ancilla qubits, and a data qubit chip spaced apart from the ancilla qubit chip, the data qubit chip including a plurality of data qubits. The system includes an interposer coupled to the ancilla qubit chip and the data qubit chip, the interposer including a dielectric material and a plurality of superconducting structures formed in the dielectric material. The superconducting structures enable transmission of quantum information between the plurality of data qubits on the data qubit chip and the plurality of ancilla qubits on the ancilla qubit chip via virtual photons for quantum error correction.

According to an embodiment of the present invention, a method of transmitting quantum information for quantum error correction includes providing a plurality of ancilla qubits, and providing a plurality of data qubits spaced apart from the plurality of ancilla qubits. The method includes mapping errors from the plurality of data qubits to the plurality of ancilla qubits via virtual photons in a superconducting microwave transmission line, and measuring the plurality of ancilla qubits to detect the errors. The method includes performing quantum error correction based on the detected errors.

According to an embodiment of the present invention, a quantum computer includes a refrigeration system under vacuum including a containment vessel. The system includes an ancilla qubit chip contained within a refrigerated vacuum environment defined by the containment vessel, the ancilla qubit chip including a plurality of ancilla qubits. The system includes a data qubit chip contained within the refrigerated vacuum environment defined by the containment vessel. The data qubit chip is spaced apart from the ancilla qubit chip and includes a plurality of data qubits. The system includes an interposer contained within the refrigerated vacuum environment defined by the containment vessel. The interposer is coupled to the ancilla qubit chip and the data qubit chip and includes a dielectric material and a plurality of superconducting structures formed in the dielectric material. Superconducting resonators comprising the superconducting structures formed in the interposer enable transmission of quantum information between the plurality of data qubits on the data qubit chip and the plurality of ancilla qubits on the ancilla qubit chip via virtual photons for quantum error correction.

DETAILED DESCRIPTION

Figure 1:
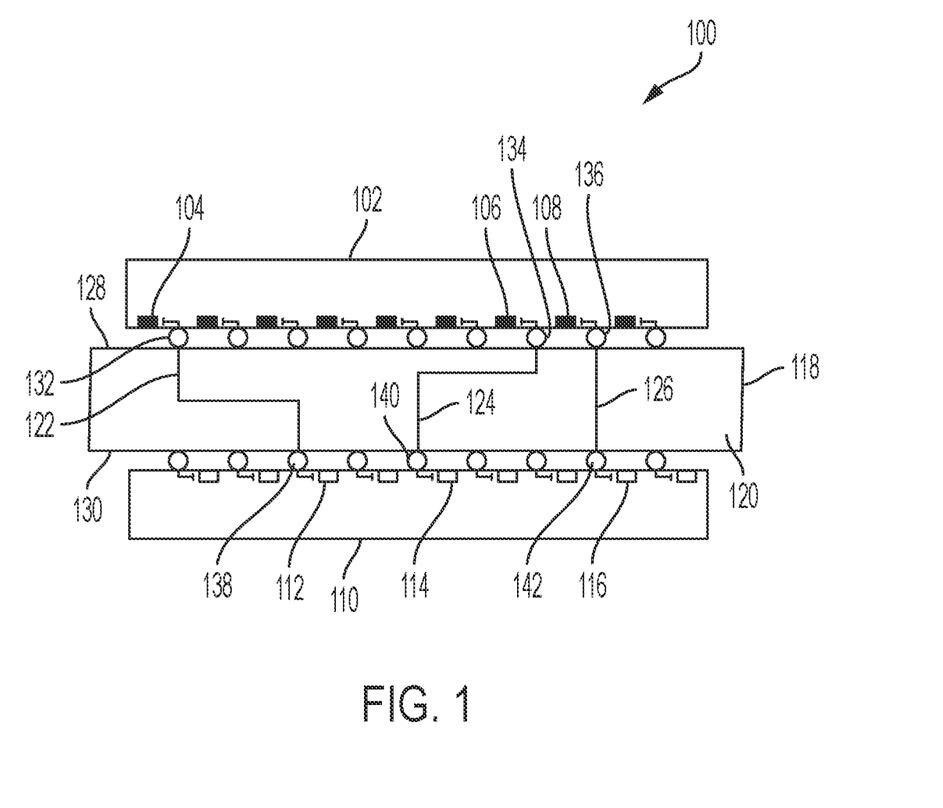
FIG. 1 is a schematic illustration of a system for transmission of quantum information for quantum error correction according to an embodiment of the invention.

FIG. 1 is a schematic illustration of a system 100 for transmission of quantum information for quantum error correction according to an embodiment of the invention. The system 100 includes an ancilla qubit chip 102 comprising a plurality of ancilla qubits 104, 106, 108. The system 100 includes a data qubit chip 110 spaced apart from the ancilla qubit chip 102. The data qubit chip 110 comprising a plurality of data qubits 112, 114, 116. The system 100 includes an interposer 118 coupled to the ancilla qubit chip 102 and the data qubit chip 110. The interposer 118 includes a dielectric material 120 and a plurality of superconducting structures 122, 124, 126 formed in the dielectric material 120. The superconducting structures 122, 124, 126 enable transmission of quantum information between the plurality of data qubits 112, 114, 116 on the data qubit chip 110 and the plurality of ancilla qubits 104, 106, 108 on the ancilla qubit chip 102 via virtual photons for quantum error correction.

As shown in FIG. 1, the interposer 118 according to an embodiment of the invention includes a first surface 128 and a second surface 130 opposite the first surface 128. The ancilla qubit chip 102 is coupled to the first surface 128 of the interposer 118, and the data qubit chip 110 is coupled to the second surface 130 of the interposer 118.

According to an embodiment of the current invention, each superconducting structure of the plurality of superconducting structures extends from a data qubit of the plurality of data qubits to an ancilla qubit of the plurality of ancilla qubits. For example, in FIG. 1, the superconducting structure 122 extends from the data qubit 112 to the ancilla qubit 104. According to an embodiment of the current invention, the data qubit 112 has a first frequency, the ancilla qubit 104 has a second frequency, and a superconducting resonator comprising the superconducting structure 122, the solder bumps 132 and 138, and the right-angle capacitor couplers on chips 102 and 110 has a third frequency. The superconducting structure 122 formed in the interposer allows the transmission of quantum information because it forms a part of a superconducting resonator. The superconducting resonator may also include the solder bumps 132 and 138 and as well as structures on the ancilla and data qubit chips that are galvanically coupled to the solder bumps 132 and 138. The structures on the ancilla and data qubit chips may be coplanar waveguide transmission lines, as is the case in the figures, although embodiments of the invention are not limited to coplanar waveguide transmission lines. In some embodiments, the superconducting structure 122 itself may form the superconducting resonator.

The frequency of the superconducting resonator, referred to herein as the third frequency, is sufficiently detuned from the first frequency and the second frequency to prevent real photon transfer between the data qubit and the ancilla qubit. Instead, quantum information is transferred from the data qubit 112 and the ancilla qubit 104 by virtual photon transfer. Virtual photon transfer ensures that the quantum information stored in the data qubit 112 is immune from the electromagnetic Purcell effect. Virtual photon transfer also protects the quantum information from the effects of dielectric loss of the insulating material forming the interposer 118.

According to an embodiment of the invention, the ancilla qubit chip is bonded to the interposer. In FIG. 1, the ancilla qubit chip 102 is bonded to the interposer 118 using a plurality of solder bumps 132, 134, 136. The solder bumps couple the ancilla qubits 104, 106, 108 to the superconducting structures 122, 124, 126. As shown in FIG. 1, the solder bumps may be galvanically coupled to the superconducting structures 122, 124, 126, and capacitively coupled the ancilla qubits 104, 106, 108. Embodiments of the current invention are not limited to the particular number of ancilla qubits, data qubits, and superconducting structures, and solder bumps shown in FIG. 1.

According to an embodiment of the invention, the data qubit chip is bonded to the interposer. In FIG. 1, the data qubit chip 110 is bonded to the interposer 118 using a plurality of solder bumps 138, 140, 142. As shown in FIG. 1, the solder bumps may be galvanically coupled to the superconducting structures 122, 124, 126, and capacitively coupled to the data qubits 112, 114, 116. The solder bumps may be formed from a superconducting material, although the embodiments of the invention are not limited to solder bumps formed from superconducting materials. One example material for the solder bumps is indium. The system 100 according to an embodiment of the present invention may include multiple ancilla qubit chips and data qubit chips. The ancilla qubit chips and data qubit chips may be bonded to a single interposer, or to multiple interposers.

Figure 2A:
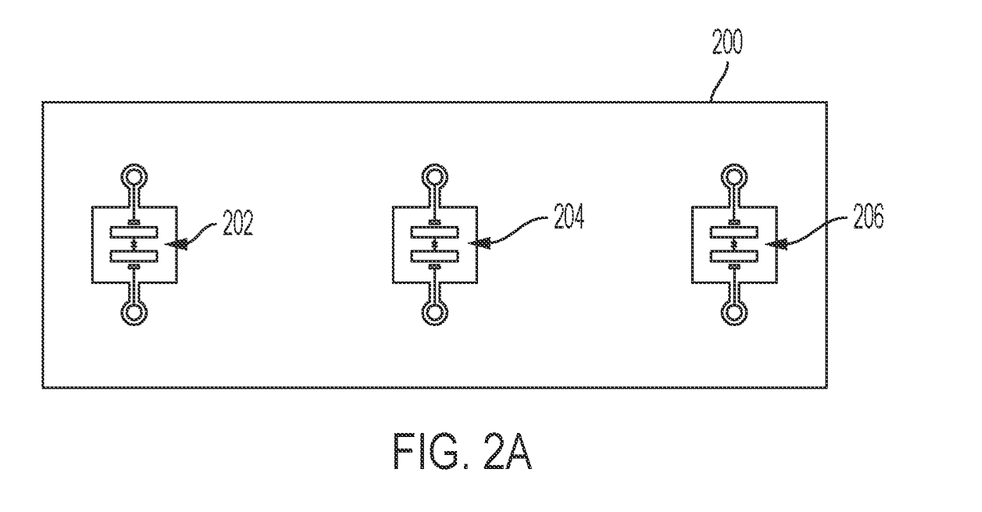
FIG. 2A is a schematic illustration of a top-down view of an ancilla qubit chip according to an embodiment of the current invention.

FIG. 2A is a schematic illustration of a top-down view of an ancilla qubit chip 200 according to an embodiment of the current invention. The ancilla qubit 200 includes three ancilla qubits 202, 204, 206. However, ancilla qubit chips according to other embodiments of the current invention are not limited to any particular number of ancilla qubits. There can be more than three, or less than three ancilla qubits in other embodiments.

Figure 2B:
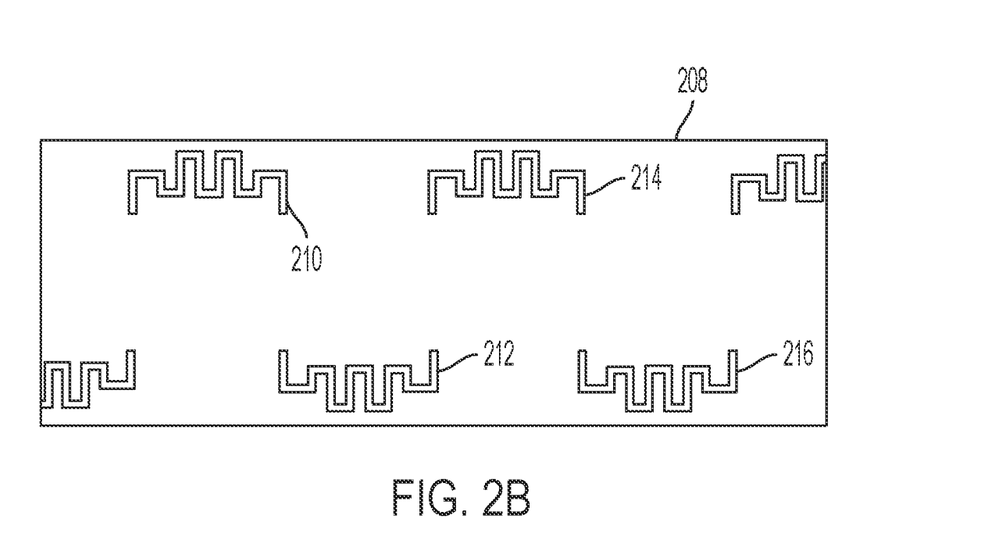
FIG. 2B is a schematic illustration of a top-down view of an interposer according to an embodiment of the current invention.

FIG. 2B is a schematic illustration of a top-down view of an interposer 208. The interposer includes a plurality of superconducting structures 210, 212, 214, 216. The superconducting structures may be superconducting vias, for example. The superconducting vias could be part of superconducting transmission line resonators that are partially or wholly formed within the interposer. The superconducting structures may be formed from one or more of niobium, aluminum, tin, electroplated rhenium, or indium, for example. Although the embodiment of FIG. 2B shows an example of four superconducting structures 210, 212, 214, 216, other embodiments could have less than four or more than four.

Figure 2C:
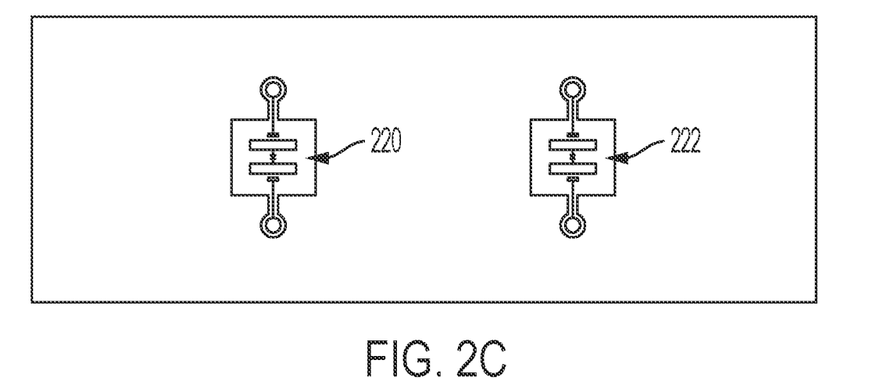
FIG. 2C is a schematic illustration of a top-down view of a data qubit chip according to an embodiment of the current invention.

FIG. 2C is a schematic illustration of a top-down view of a data qubit chip 218. The data qubit chip 218 includes two data qubits 220, 222. Other embodiments of data qubit chips could have more than or less than two data qubits.

Figure 2D:
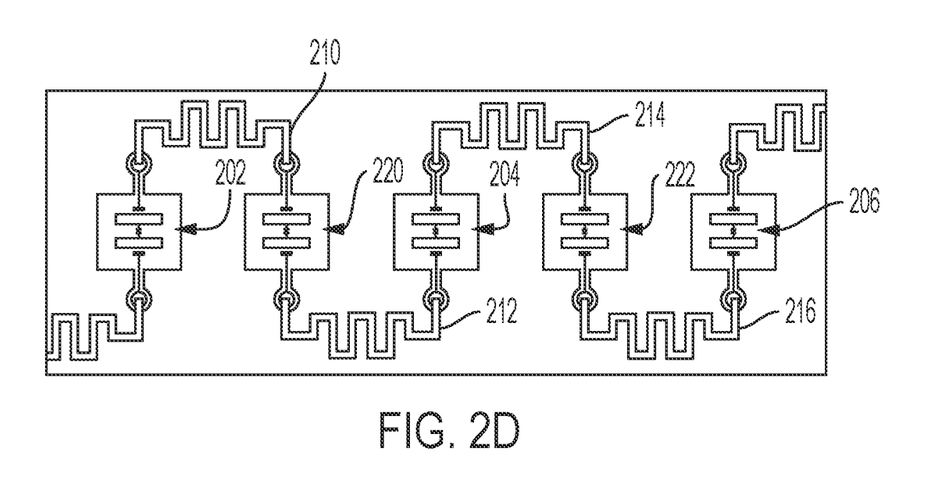
FIG. 2D is a schematic illustration of a top-down view of the interposer of FIG. 2B coupled to the ancilla chip of FIG. 2A and the data chip of FIG. 2C according to an embodiment of the current invention.

FIG. 2D is a schematic illustration of a top-down view of the interposer coupled to the ancilla chip and the data chip. The ancilla qubits 202, 204, 206 and the data qubits 220, 222 are connected to each other by the superconducting structures 210, 212, 214, 216.

Embodiments of the current invention enable transmission of quantum information for quantum error correction. Quantum error correction often requires a large number of data qubits and ancilla qubits to be coupled to each other. The data qubit are qubits that have relatively long relaxation and coherence times, while the ancilla qubits may be qubits that have relatively short relaxation and coherence times. Quantum information is spread over a collection of data qubits. The data qubits are coupled to ancilla qubits such that errors in the quantum information are mapped form the data qubits to the ancilla qubits. The ancilla qubits can be measured to detect and/or correct the errors.

Quantum error correction algorithms, such as, but not limited to, the Surface Code, the Shor Code, and the Steane Code require frequent measurements of the ancilla qubits. These measurements provide information about the data qubits to which the ancilla qubits are coupled, and also stabilize the data qubits. The frequency of the measurements necessitates fast measurements, which require strong coupling between the measurement resonators coupled to the ancilla qubits and the environment. Although the strong coupling enables fast measurement of the ancilla qubits, it also makes the ancilla qubits more susceptible to environmental noise and increases the spontaneous decay rate of the ancilla qubits through the Purcell effect. This strong coupling, if made to the data qubits, would shorten the lifetime of the quantum states in the data qubits.

Embodiments of the current invention enable strong coupling between the ancilla qubits and the environment, while reducing the coupling between the data qubits and the environment. The ancilla qubits are physically separated from the data qubits, and are coupled to the data qubits by superconducting structures formed in the interposer.

The physical separation also allows different materials and processes to be used for the formation of the data qubit chip and the ancilla qubit chip. Although both chips may include a plurality of qubits, the quality requirements for the data qubits and ancilla qubits may be very different. The requirements for the ancilla qubits may be based on how frequently they are measured. According to some embodiments, the ancilla qubit measurement cycle may be about 1 µs, so the ancilla qubits may have coherence times greater than 1 µs, for example, on the order of a few microseconds. The material requirements for such qubits are not as stringent as those used to fabricate higher quality qubits, such as the data qubits. Further, the ancilla qubit chip can be formed and modified using fabrication methods such as lithography that can change the frequency of the ancilla qubits. The ancilla qubit chip can also be formed such that the ancilla qubits are tunable qubits. While having tunable qubits can aid in system control, the process of forming the tunable qubits can require breaking the ground plane of the microwave resonators coupled to the qubits. This could be undesirable for the data qubits because of the introduction of flux noise susceptibility and spurious microwave modes, but may be acceptable for the ancilla qubits, which are allowed a shorter coherence time.

According to an embodiment of the current invention, the interposer includes a dielectric material that is, for example, a printed circuit board, an organic laminate, a silicon chip, a ceramic, a glass-reinforced epoxy laminate material such as FR-4, duroid, or polyether ether ketone (PEEK).

Figure 3:
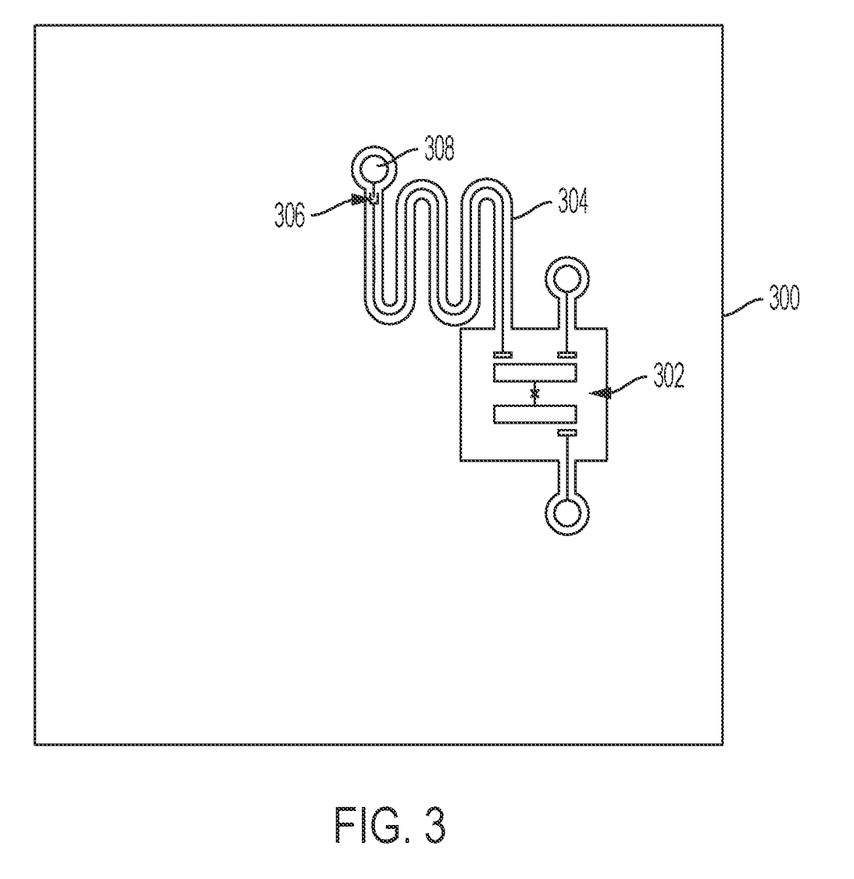
FIG. 3 is a schematic illustration of an ancilla qubit chip that includes an ancilla qubit and an ancilla measurement resonator configured for measurement of the ancilla qubit according to an embodiment of the current invention.

According to an embodiment of the current invention, the ancilla qubit chip includes ancilla measurement resonators coupled to the plurality of ancilla qubits. The ancilla measurement resonators are configured for measurement of the plurality of ancilla qubits. The ancilla measurement resonators may be, for example, superconducting microwave coplanar waveguide resonators. FIG. 3 is a schematic illustration of an ancilla qubit chip 300 that includes an ancilla qubit 302 and an ancilla measurement resonator 304 configured for measurement of the ancilla qubit 302. The ancilla measurement resonator 304 may capacitively couple to the ancilla qubit 302 to measurement and control instruments. FIG. 3 shows a capacitor 306 that capacitively couples the ancilla measurement resonator 304 and the ancilla qubit 302 to a port 308 with measurement and control instruments.

Figure 4:
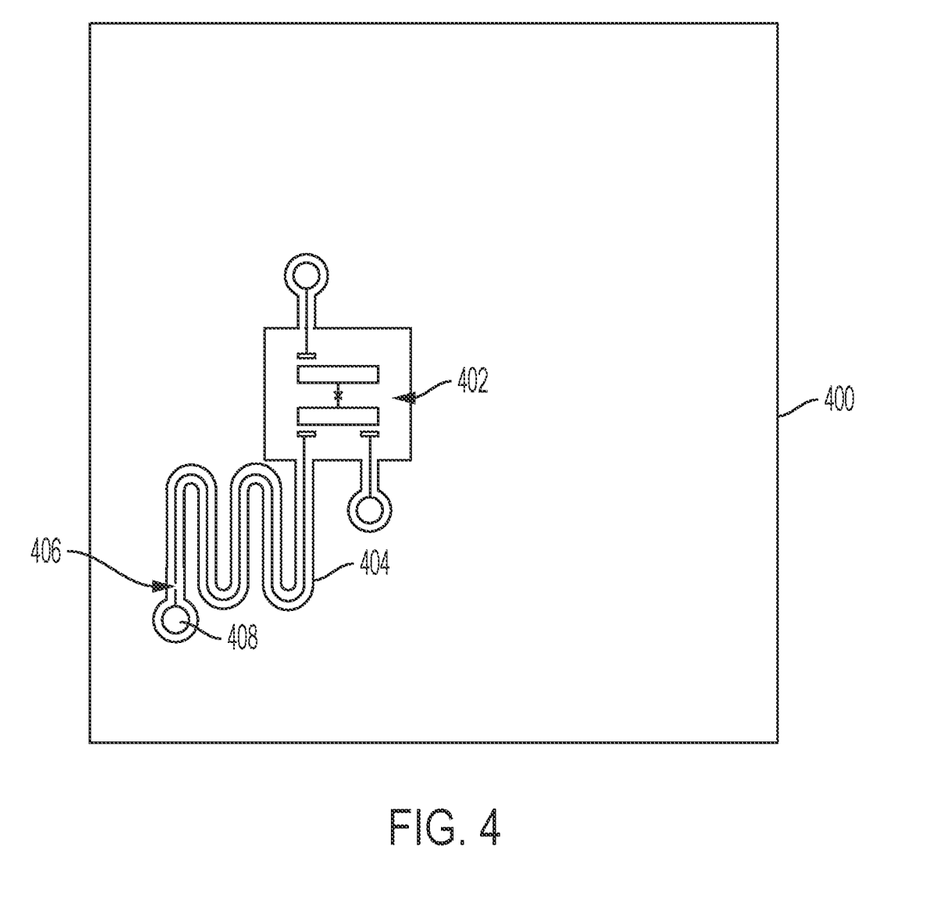
FIG. 4 is a schematic illustration of a data qubit chip that includes a data qubit and a data measurement resonator configured for measurement of the data qubit according to an embodiment of the current invention.

According to an embodiment of the current invention, the data qubit chip includes data measurement resonators coupled to the plurality of data qubits. The data measurement resonators may be, for example, superconducting microwave resonators. FIG. 4 is a schematic illustration of a data qubit chip 400 that includes a data qubit 402 and a data measurement resonator 404 configured for measurement of the data qubit 402. FIG. 4 shows a capacitor 406 that capacitively couples the data measurement resonator 404 and the data qubit 402 to a port 408 for measurement and control instruments.

Figure 5:
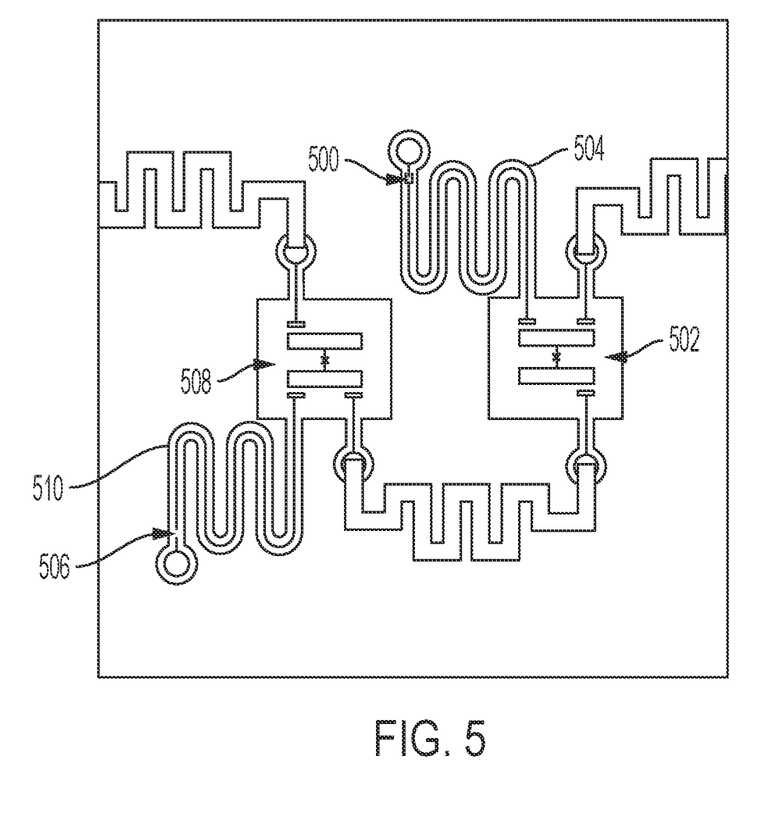
FIG. 5 is a schematic illustration of the ancilla qubit chip of FIG. 3 coupled to the data qubit chip of FIG. 4 by an interposer according to an embodiment of the current invention.

FIG. 5 is a schematic illustration of the ancilla qubit chip 300 of FIG. 3 coupled to the data qubit chip 400 of FIG. 4 by an interposer. As shown in FIG. 5, the capacitor 500 coupling the ancilla qubit 502 and the ancilla measurement resonator 504 to measurement and control instruments is much larger than the capacitor 506 coupling the data qubit 508 and the data measurement resonator 510 to measurement and control instruments. The strong coupling between the ancilla measurement resonator 504 and the readout electronics enables fast measurement of the ancilla qubit 502. This is useful for quantum error correction, which may require measurement cycles on the order of one per 1 µs. In contrast, the data measurement resonator 510 is weakly coupled to the measurement electronics because the data qubit 508 may only be read when the quantum algorithm is complete, instead of every 1 µs. A longer measurement time may be used to make up for the weak coupling. The weak coupling between the data qubit 508 and the measurement electronics helps preserve the coherence of the data qubit 508. The data qubit 508 may have relaxation and coherence times that are greater than 75 µs, for example. The data qubit 508 may have relaxation and coherence times that are on the order of 100 µs, for example.

Figure 6:
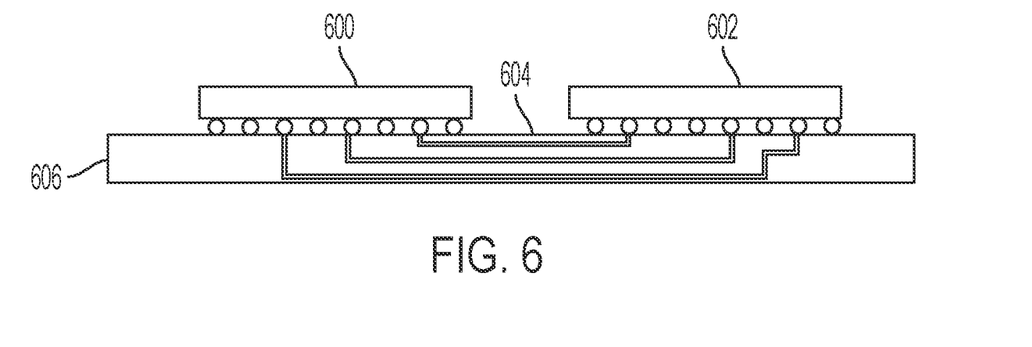
FIG. 6 is a schematic illustration of an ancilla qubit chip and a data qubit chip coupled to the same surface of an interposer.

As an alternative to the configuration shown in FIG. 1, the ancilla qubit chip and the data qubit chip may be coupled to the same surface of the interposer. FIG. 6 is a schematic illustration of an ancilla qubit chip 600 and a data cubit chip 602 coupled to the same surface 604 of an interposer 606.

According to an embodiment of the current invention, for each data qubit of the plurality of data qubits, the superconducting structures enable transmission of quantum information between the data qubit and at least two ancilla qubits of the plurality of ancilla qubits. Similarly, for each ancilla qubit of the plurality of ancilla qubits, the superconducting structures may enable transmission of quantum information between the ancilla qubit and at least two data qubits of the plurality of data qubits. Quantum information can be mapped from at least two data qubits to ancilla qubits to allow measurement of an eigenstate of the data qubits, so that performing the measurement does not destroy the quantum information.

Figure 7:
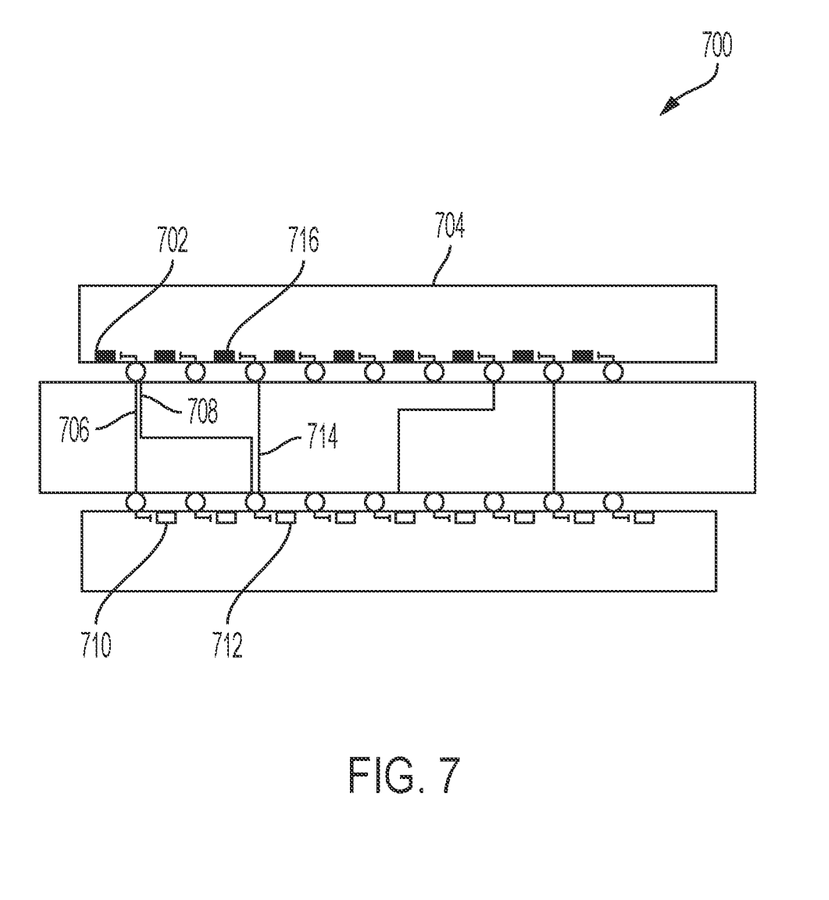
FIG. 7 is a schematic illustration of a system for transmission of quantum information for quantum error correction according to an embodiment of the current invention.

FIG. 7 is a schematic illustration of a system 700 for transmission of quantum information for quantum error correction according to an embodiment of the current invention. An ancilla qubit 702 on the ancilla qubit chip 704 is coupled to two superconducting structures 706, 708. The superconducting structures enable transmission of quantum information between the ancilla qubit 702 and two data qubits 710, 712. Another superconducting structure 714 enables transmission of quantum information between the data qubit 712 and a second ancilla qubit 716. Although only two of the qubits in FIG. 7 are illustrated as being coupled to two other qubits, each of the qubits on the ancilla chip and the data chip may be coupled to two or more qubits on the other chip by superconducting structures. Quantum error correction codes, such as the Surface Code, for example, may require that each data qubit be coupled to multiple ancilla qubits, and each ancilla qubit be coupled to multiple data qubits. In the example of the Surface Code, errors can be mapped from the data qubits to the ancilla qubits using CNOT gates, via virtual photons exchanged through the superconducting structures. Measurement of the ancilla qubits may give the parity of the data qubits, for example in the Surface Code. Since parity is an eigenvalue of the Bell state, measurement of the ancilla qubits stabilizes the quantum information in the data qubits. Although the Surface Code is discussed herein, the embodiments of the current invention are not limited to the Surface Code. Other quantum error correction algorithms may be used.

Figure 8:
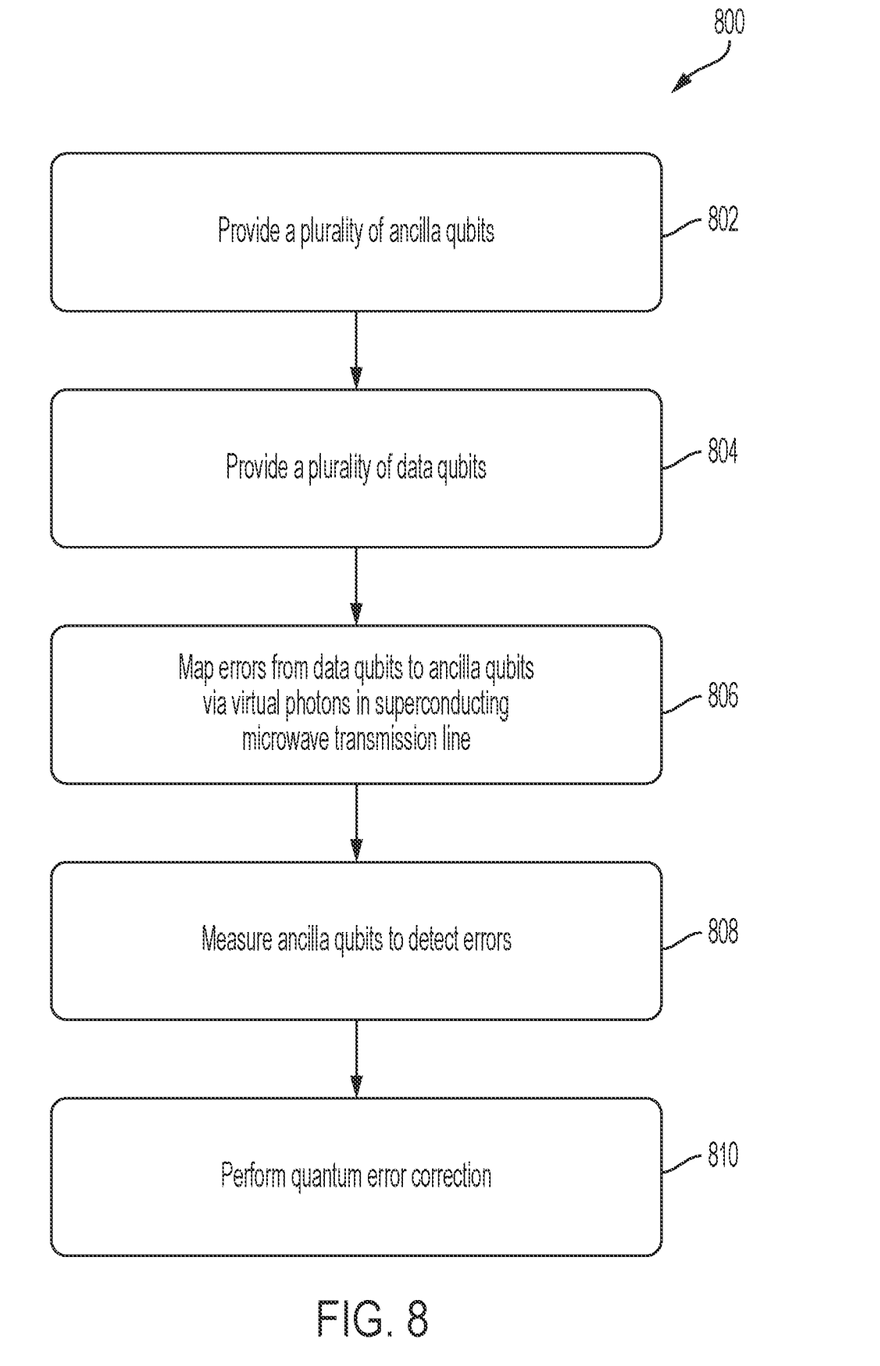
FIG. 8 is a flowchart that illustrates a method of transmitting quantum information for quantum error correction according to an embodiment of the current invention.

FIG. 8 is a flowchart that illustrates a method 800 of transmitting quantum information for quantum error correction according to an embodiment of the current invention. The method 800 includes providing a plurality of ancilla qubits 802, and providing a plurality of data qubits 804 spaced apart from the plurality of ancilla qubits. The method 800 includes mapping errors from the plurality of data qubits to the plurality of ancilla qubits via virtual photons in a superconducting microwave transmission line 806. The method 800 further includes measuring the plurality of ancilla qubits to detect the errors 808, and performing quantum error correction 810 based on the detected errors.

According to an embodiment of the invention, measuring the plurality of ancilla qubits 808 gives a parity of the plurality of data qubits.

Figure 9:
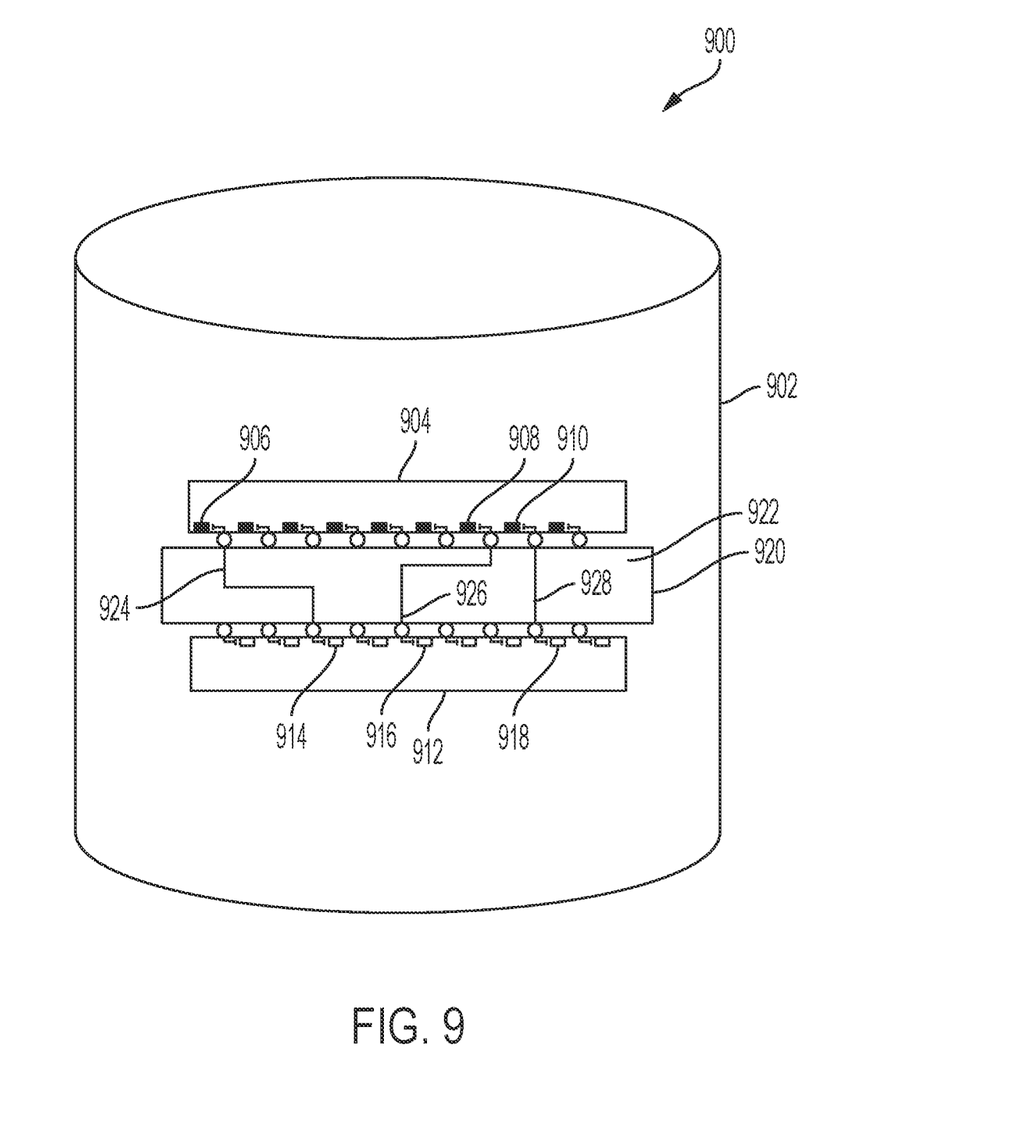
FIG. 9 is a schematic illustration of a quantum computer according to an embodiment of the present invention.

FIG. 9 is a schematic illustration of a quantum computer 900 according to an embodiment of the present invention. The quantum computer 900 includes a refrigeration system under vacuum including a containment vessel 902. The quantum computer 900 includes an ancilla qubit chip 904 contained within a refrigerated vacuum environment defined by the containment vessel 902. The ancilla qubit chip 904 includes a plurality of ancilla qubits 906, 908, 910. The quantum computer 900 includes a data qubit chip 912 contained within the refrigerated vacuum environment defined by the containment vessel 902. The data qubit chip 912 is spaced apart from the ancilla qubit chip 904 and includes a plurality of data qubits 914, 916, 918. The quantum computer 900 includes an interposer 920 contained within the refrigerated vacuum environment defined by the containment vessel 902. The interposer 920 is coupled to the ancilla qubit chip 904 and the data qubit chip 912 and includes a dielectric material 922 and a plurality of superconducting structures 924, 926, 928 formed in the dielectric material 922. The superconducting structures 924, 926, 928 enable transmission of quantum information between the plurality of data qubits 914, 916, 918 on the data qubit chip 912 and the plurality of ancilla qubits 906, 908, 910 on the ancilla qubit chip 904 via virtual photons for quantum error correction.

The quantum computer according to an embodiment of the current invention may include a plurality of ancilla qubit chips, data qubit chips, and interposers. Further, the embodiments of the invention are not limited to the particular number of ancilla qubits, data qubits, and superconducting structures, and solder bumps shown in FIG. 9.

Embodiments of the current invention enable transfer of quantum information using a dielectric interposer with partially embedded microwave transmission line bus resonators. The quantum information is communicated via virtual photons in the resonators. The use of virtual photons ensures that quantum information is not lost due to the electromagnetic Purcell effect or the dielectric loss of the material. By separating qubit chips into those that include data qubits (long-lived, high quality qubits) and those that include ancilla qubits (need fast measurement and control, and are therefore more susceptible to loss channels), errors may be mapped onto the ancilla qubits using the superconducting interposer.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A system for transmission of quantum information for quantum error correction, comprising:
    a first data qubit having a first excitation frequency;
    a first ancilla qubit having a second excitation frequency and being spaced apart from said data qubit; and
    a resonator arranged between said data first qubit and said first ancilla qubit to provide a transfer of quantum information therebetween,
    wherein a resonance frequency of said resonator is detuned from said first excitation frequency and said second excitation frequency to prevent real photon transfer between said first data qubit and said first ancilla qubit, and
    wherein said resonator enables transmission of quantum information between said first data qubit and said first ancilla qubit via virtual photons for quantum error correction.

2. The system for transmission of quantum information for quantum error correction according to claim 1, further comprising:
    a second data qubit having a third excitation frequency; and
    a second resonator arranged between said second data qubit and said first ancilla qubit to provide a transfer of quantum information therebetween,
    wherein a second resonance frequency of said second resonator is detuned from said third excitation frequency and said second excitation frequency to prevent real photon transfer between said second data qubit and said first ancilla qubit, and
    wherein said second resonator enables transmission of quantum information between said second data qubit and said first ancilla qubit via virtual photons for quantum error correction.

3. The system for transmission of quantum information for quantum error correction according to claim 1, further comprising:
    a second ancilla qubit having a fourth excitation frequency; and
    a third resonator arranged between said first data qubit and said second ancilla qubit to provide a transfer of quantum information therebetween,
    wherein a third resonance frequency of said third resonator is detuned from said fourth excitation frequency and said first excitation frequency to prevent real photon transfer between said first data qubit and said second ancilla qubit, and
    wherein said third resonator enables transmission of quantum information between said first data qubit and said second ancilla qubit via virtual photons for quantum error correction.

4. The system for transmission of quantum information for quantum error correction according to claim 1, wherein the first ancilla qubit is a frequency-tunable ancilla qubit.

5. The system for transmission of quantum information for quantum error correction according to claim 3, wherein the first ancilla qubit and said second ancilla qubit are frequency-tunable ancilla qubits.

6. The system for transmission of quantum information for quantum error correction according to claim 1, wherein the first ancilla qubit has a relaxation time and a coherence time that are greater than 1 micro second.

7. The system for transmission of quantum information for quantum error correction according to claim 3, wherein the first ancilla qubit and said second ancilla qubit each has a relaxation time and a coherence time that are greater than 1 micro second.

8. The system for transmission of quantum information for quantum error correction according to claim 1, wherein said first data qubit has a relaxation time and a coherence time that are greater than or equal to 75 micro seconds.

9. The system for transmission of quantum information for quantum error correction according to claim 2, wherein the first data qubit and said second data qubit each has a relaxation time and a coherence time that are greater than or equal to 75 micro seconds.

10. A quantum system, comprising:
an ancilla qubit chip disposed in a containment vessel, the ancilla qubit chip comprising a plurality of ancilla qubits;
a data qubit chip disposed in the containment vessel and spaced apart from said ancilla qubit chip, said data qubit chip comprising a plurality of data qubits; and
an interposer coupled to said ancilla qubit chip and said data qubit chip and disposed in the containment vessel, said interposer comprising a dielectric material and a plurality of superconducting structures formed in said dielectric material,
wherein a data qubit of said plurality of data qubits has a first frequency, an ancilla qubit of said plurality of ancilla qubits has a second frequency, and a superconducting resonator comprising a superconducting structure of said plurality of superconducting structures formed in said interposer has a third frequency,
wherein said third frequency is detuned from said first frequency and said second frequency to prevent real photon transfer between said data qubit and said ancilla qubit, and
wherein said superconducting structures enable transmission of quantum information between said plurality of data qubits on said data qubit chip and said plurality of ancilla qubits on said ancilla qubit chip via virtual photons for quantum error correction.

11. The quantum system of claim 10, comprising:
ancilla measurement resonators coupled to said plurality of ancilla qubits, said ancilla measurement resonators configured for measurement of said plurality of ancilla qubits; and
data measurement resonators coupled to said plurality of data qubits, said data measurement resonators configured for measurement of said plurality of data qubits.

12. A method for manufacturing a system for transmission of quantum information for quantum error correction, comprising:
providing an ancilla qubit chip comprising a plurality of ancilla qubits;
providing a data qubit chip spaced apart from said ancilla qubit chip, said data qubit chip comprising a plurality of data qubits; and
coupling an interposer to said ancilla qubit chip and said data qubit chip, said interposer comprising a dielectric material and a plurality of superconducting structures formed in said dielectric material,
wherein a data qubit of said plurality of data qubits has a first frequency, an ancilla qubit of said plurality of ancilla qubits has a second frequency, and a superconducting resonator comprising a superconducting structure of said plurality of superconducting structures formed in said interposer has a third frequency,
wherein said third frequency is detuned from said first frequency and said second frequency to prevent real photon transfer between said data qubit and said ancilla qubit, and
wherein said superconducting structures enable transmission of quantum information between said plurality of data qubits on said data qubit chip and said plurality of ancilla qubits on said ancilla qubit chip via virtual photons for quantum error correction.

\* \* \* \* \*